(12) United States Patent
Tanaka et al.

(10) Patent No.: US 8,681,826 B2
(45) Date of Patent: Mar. 25, 2014

(54) METHOD FOR TUNING SEMICONDUCTOR LASER

(75) Inventors: Hirokazu Tanaka, Kanagawa (JP); Tsutomu Ishikawa, Kanagawa (JP); Toyotoshi Machida, Kanagawa (JP)

(73) Assignee: Sumitomo Electric Device Innovations, Inc., Yokohama-shi, Kanagawa (JP)

( * ) Notice: Subject to any disclaimer, the term of this patent is extended or adjusted under 35 U.S.C. 154(b) by 32 days.

(21) Appl. No.: 13/117,557

(22) Filed: May 27, 2011

(65) Prior Publication Data

US 2011/0228800 A1    Sep. 22, 2011

Related U.S. Application Data

(63) Continuation of application No. PCT/JP2009/069957, filed on Nov. 26, 2009.

(30) Foreign Application Priority Data

Nov. 28, 2008    (JP) .................................. 2008-303939

(51) Int. Cl.
    *H01S 3/10*    (2006.01)

(52) U.S. Cl.
    USPC ..................... 372/20; 372/38.07; 372/29.015; 372/33

(58) Field of Classification Search
    USPC .............................. 372/20, 33, 38.07, 29.015
    See application file for complete search history.

(56) References Cited

U.S. PATENT DOCUMENTS

| | | | |
|---|---|---|---|
| 5,379,318 A | 1/1995 | Weber | |
| 5,581,572 A | 12/1996 | Delorme et al. | |
| 2003/0007524 A1 | 1/2003 | Gotoda | |
| 2007/0036188 A1 | 2/2007 | Fujii | |
| 2007/0230521 A1* | 10/2007 | Ishikawa et al. | 372/34 |
| 2007/0230522 A1* | 10/2007 | Ishikawa | 372/34 |
| 2009/0122817 A1 | 5/2009 | Sato et al. | |
| 2010/0296532 A1* | 11/2010 | Tanaka et al. | 372/20 |

FOREIGN PATENT DOCUMENTS

| | | |
|---|---|---|
| EP | 0 667 660 A1 | 8/1995 |
| EP | 1 703 603 A1 | 9/2006 |
| EP | 1 708 323 A2 | 10/2006 |
| EP | 1 753 104 A2 | 2/2007 |
| JP | 07-263817 A | 10/1995 |

(Continued)

OTHER PUBLICATIONS

International Search Report of PCT/JP2009/069957, date of mailing Jan. 19, 2010.

(Continued)

*Primary Examiner* — Jessica Stultz
*Assistant Examiner* — Joshua King
(74) *Attorney, Agent, or Firm* — Westerman, Hattori, Daniels & Adrian, LLP

(57) ABSTRACT

A method for tuning a semiconductor laser including a plurality of wavelength selection portions, each of which has a periodic wavelength characteristic, including: controlling a value of a refractive index controlling means of the wavelength selection portions to achieve a desired output wavelength of the laser; and shifting the value when the value is equal to or excess of a predetermined value to a basal value side until achieving the desired output wavelength, the basal value being a value without applying refractive index variation by the refractive index controlling means, the predetermined value being a value for shifting one period of the periodic wavelength characteristic.

11 Claims, 8 Drawing Sheets

(56) References Cited

FOREIGN PATENT DOCUMENTS

| | | |
|---|---|---|
| JP | 9-074250 A | 3/1997 |
| JP | 2003-017803 A | 1/2003 |
| JP | 2003-023208 A | 1/2003 |
| JP | 2003-069138 A | 3/2003 |
| JP | 2003-318483 A | 11/2003 |
| JP | 2006-245086 A | 9/2006 |
| JP | 2007-048988 A | 2/2007 |
| WO | 2007/029647 A1 | 3/2007 |

OTHER PUBLICATIONS

Extended European Search Report dated Dec. 20, 2012, issued in corresponding European patent application No. 09829136.2.

* cited by examiner

CSG2
CSG1
CSG3

METHOD FOR TUNING SEMICONDUCTOR LASER

CROSS-REFERENCE TO RELATED APPLICATION

The present application is a continuation of and claims priority to International Patent Application No. PCT/JP2009/069957 filed on Nov. 26, 2009, which claims priority to Japanese Patent Application No. 2008-303939 filed on Nov. 28, 2008, subject matter of these patent documents is incorporated by reference herein in its entirety.

BACKGROUND (i) Technical Field

A certain aspect of the embodiments discussed herein is related to a method for tuning a semiconductor laser.

(ii) Related Art

A wavelength tunable laser disclosed in Japanese Patent Application Publication No. 2007-48988 has a SG-DBR (Sampled Grating Distributed Bragg Reflector) region having a plurality of wavelength selection portions. A heater controls a temperature of each wavelength selection portion. Thus, wavelength selection characteristics are controlled with refraction index changing.

In the wavelength tunable laser, a reflection spectrum wavelength selected through overlapping of wavelength characteristics of each wavelength selection portion of the SG-DBR region and a gain spectrum wavelength of a SG-DFB (Sampled Grating Distributed Feedback) region are made to correspond to each other, and an oscillation wavelength is fixed to a predetermined wavelength.

SUMMARY

It is necessary to tune a parameter value of the wavelength selection portion of the wavelength tunable laser with respect to each wavelength channel in advance using the tunable laser. After tuning the parameter value of the wavelength selection portion of the wavelength tunable laser, the parameter value is stored to a memory (EP-ROM etc.). In a field where the wavelength tunable laser is operating, a controller of the wavelength tunable laser reads the parameter value with respect to a target wavelength of the wavelength tunable laser from the memory and supplies the value to target electrodes of the laser. On the other hand, it is necessary to control a predetermined relation between each wavelength selection portion in order to select only a predetermined single wavelength. However, it is confirmed that a very large parameter value is needed when the field of the wavelength tunable laser is operating by a parameter value which is acquired by tuning the above relation is keeping.

According to an aspect of the present invention, there is provided a method for tuning a semiconductor laser including a plurality of wavelength selection portions, each of which has a periodic wavelength characteristic, including: controlling a value of a refractive index controlling means of the wavelength selection portions to achieve a desired output wavelength of the laser; and shifting the value when the value is equal to or excess of a predetermined value to a basal value side until achieving the desired output wavelength, the basal value being a value without applying refractive index variation by the refractive index controlling means, the predetermined value being a value for shifting one period of the periodic wavelength characteristic.

DETAILED DESCRIPTION

A description will be given of a best mode for carrying the present invention.

First Embodiment

Figure 1:
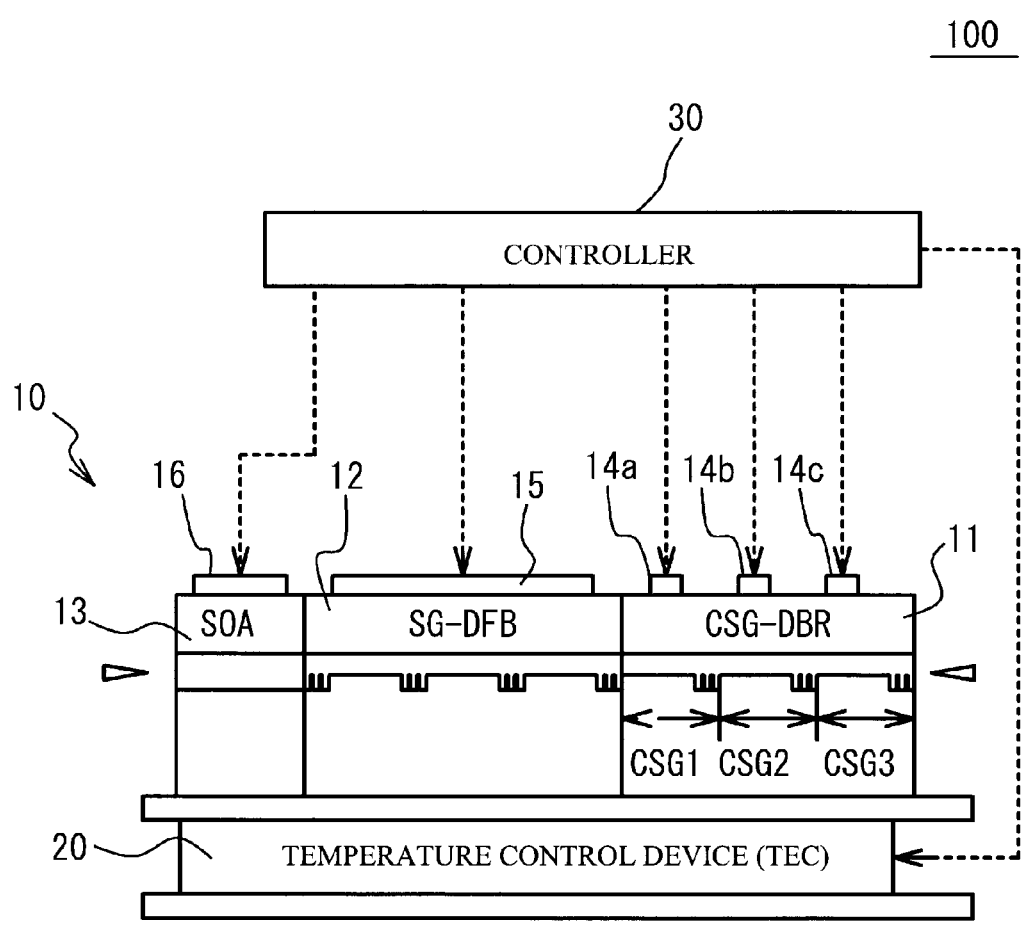
FIG. 1 illustrates a schematic view of a laser device in accordance with a first embodiment.

FIG. 1 illustrates a schematic view of a laser device 100 in accordance with a first embodiment. As illustrated in FIG. 1, the laser device 100 has a semiconductor laser 10, a temperature control device 20 and a controller 30. The semiconductor laser 10 is provided on the temperature control device 20. A description will be given of details of each component.

The semiconductor laser 10 has a structure in which a CSG-DBR (Chirped Sampled Grating Distributed Bragg Reflector) region 11, a SG-DFB region 12 and a SOA (Semiconductor Optical Amplifier) region 13 are coupled in this order.

The CSG-DBR region 11 has an optical waveguide having gratings at a given interval. The optical waveguide of the CSG-DBR region 11 has a plurality of segments in which a diffraction grating region having a grating is coupled to a space region. In the CSG-DBR region 11, the segments of the CSG-DBR region 11 have a different optical length.

The optical waveguide of the CSG-DBR region 11 is made of semiconductor crystal of which absorption edge wavelength is shorter than a laser oscillation wavelength. In the embodiment, the CSG-DBR region 11 has three segments (a segment CSG1 to a segment CSG3). The CSG-DBR region 11 has heaters according to each segment. In the embodiment, three heaters 14a to 14c are provided on the CSG-DBR region 11 according to the segments CSG1 to the segment CSG3.

The SG-DFB region 12 has an optical waveguide having gratings at a given interval. The optical waveguide of the SG-DFB region 12 has a plurality of segments in which a diffraction grating region having a grating is coupled to a space region. In the SG-DFB region 12, each segment has substantially the same optical length. The optical waveguide of the SG-DFB region 12 is made of semiconductor crystal having a gain with respect to a laser oscillation at an objective wavelength. An electrode 15 is provided on the SG-DFB region 12.

The SOA region 13 has an optical waveguide made of semiconductor crystal for amplifying or absorbing a light with a current control. An electrode 16 is provided on the SOA region 13. The optical waveguides of the CSG-DBR region 11, the SG-DFB region 12 and the SOA region 13 are optically coupled to each other.

The temperature control device 20 has a pertier element and so on, and controls a temperature of the semiconductor laser 10. The controller 30 has a control portion having a CPU (Central Processing Unit), a RAM (Random Access Memory), a ROM (Read Only Memory) and so on, and has a power supply. The ROM of the controller 30 stores control information of the semiconductor laser 10, a control program and so on.

Next, a description will be given of an operation of the laser device 100. The controller 30 provides a given current to the electrode 15. Thus, the optical waveguide of the SG-DFB region 12 generates a light. The generated light propagates in the optical waveguides of the CSG-DBR region 11 and the SG-DFB region 12, is reflected and amplified repeatedly, and the light propagates in the optical waveguides of the SOA region 13, is amplified, and is emitted outside. The controller 30 provides a given current to the electrode 16. Thus, an output of the semiconductor laser 10 is kept constant.

Next, the controller 30 controls the temperature of the segments CSG1 to CSG3 by controlling the heaters 14a to 14c. Thereby, equivalent refraction index of the segments CSG1 to CSG3 is changed. In this case, the reflection characteristics of the segments CSG1 to CSG3 are changed. Thus, the oscillation wavelength of the semiconductor laser 10 may be changed. With the control, the laser device 100 makes the semiconductor laser 10 oscillate at a desirable wavelength.

Figure 2A:
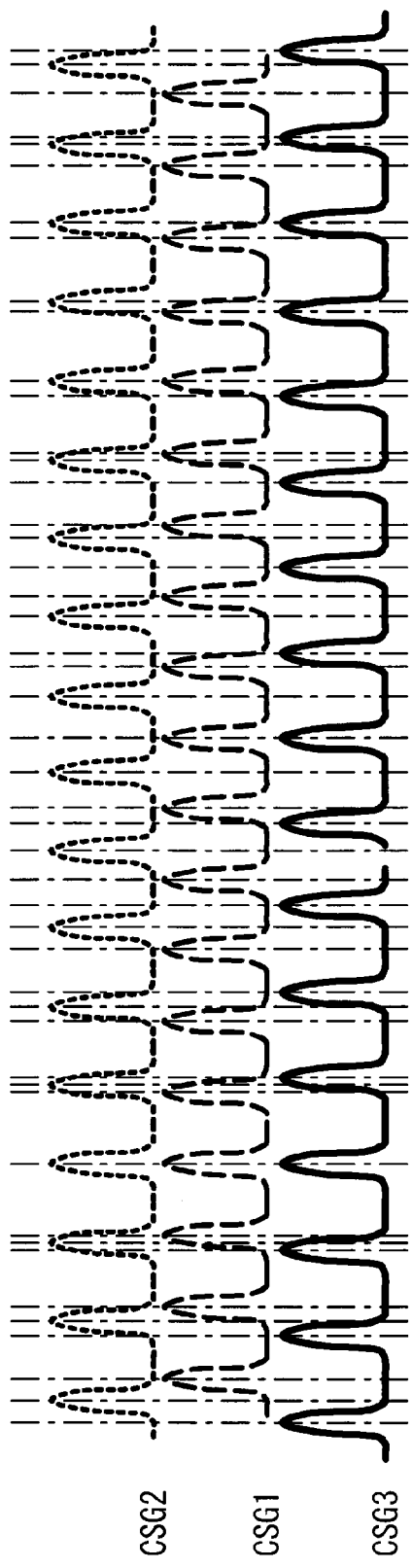
FIG. 2A and FIG. 2B illustrate a reflection spectrum of a segment before heating by a heater.
Figure 2B:
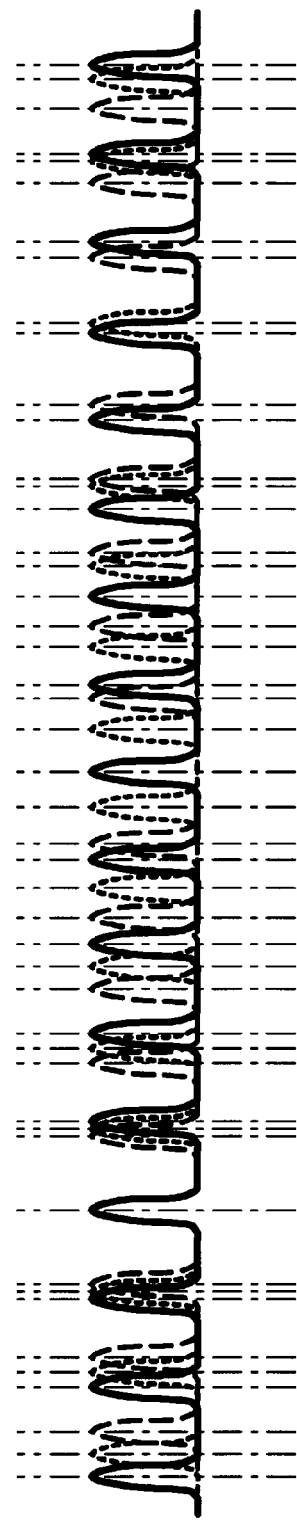

FIG. 2A illustrates a schematic view of reflection spectrums of the segments CSG1 to CSG3 before heating by the heaters 14a to 14c. FIG. 2B illustrates overlapped reflection spectrums of the segments CSG1 to CSG3. As illustrated in FIG. 2A, the reflection spectrums of the segments CSG1 to CSG3 have a different periodic peak, because the segments CSG1 to CSG3 have a different optical length. Therefore, as illustrated in FIG. 2B, the reflection spectrums do not overlap at a given wavelength, and overlap at another wavelength.

Figure 3A:
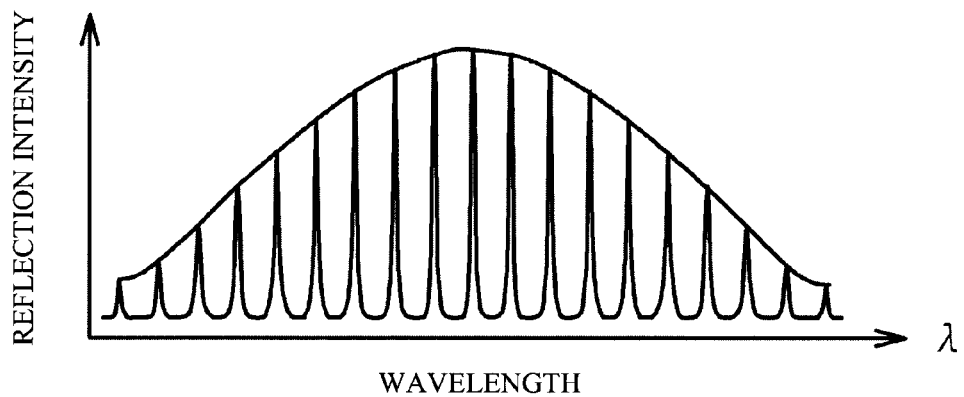
FIG. 3A and FIG. 3B illustrate a reflection spectrum of a CSG-DBR region and a SG-DFB region.

FIG. 3A illustrates a reflection spectrum of the CSG-DBR region 11. The reflection spectrum of the CSG-DBR region 11 is obtained by overlapping the reflection spectrums of the segments CSG1 to CSG3. As illustrated in FIG. 3A, reflection intensity differs at each peak wavelength. Thus, an envelope curve having a bell shape is formed. When wavelength range is enlarged, an envelope curve in which a plurality of bells is arrayed is formed. Thus, the CSG-DBR region 11 has wavelength dependency with respect to the reflection intensity.

Figure 3B:
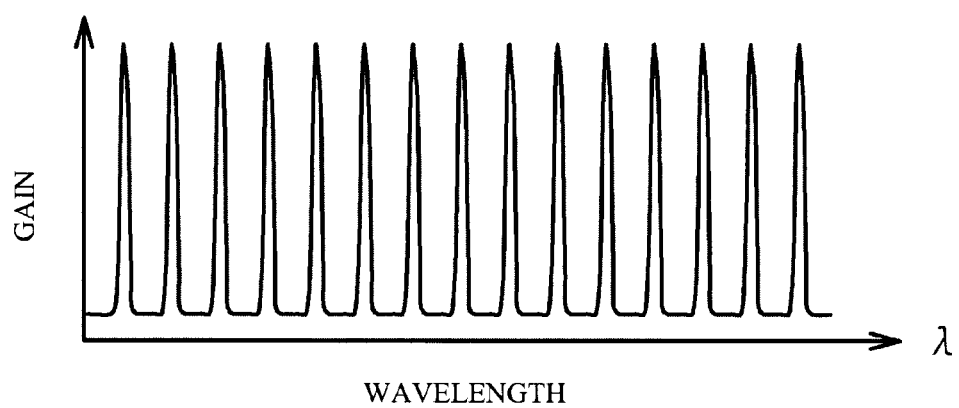

FIG. 3B illustrates a reflection spectrum of the SG-DFB region 12. The reflection intensity is approximately constant at each peak wavelength, because the optical length of each segment of the SG-DFB region 12 is substantially the same and each temperature of the segments is kept constant by the temperature control device 20.

When a wavelength of the reflection spectrum of the CSG-DBR region 11 having relatively large reflection intensity corresponds to any wavelength of the reflection spectrum of the SG-DFB region 12, the semiconductor laser 10 laser-oscillates at the corresponding wavelength. It is therefore possible to select a laser oscillation wavelength by changing a relation between wavelength and reflection intensity of the CSG-DBR region 11.

Figure 4A:
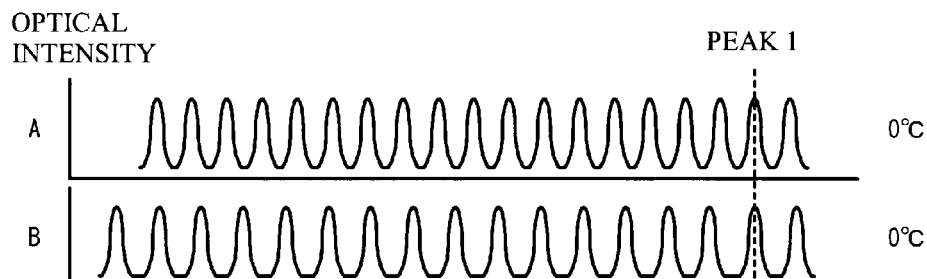
FIG. 4A to FIG. 4D illustrate a principle of a control of the semiconductor laser in accordance with the first embodiment.

Next, a description will be given of a principle of a control of the semiconductor laser in accordance with the embodiment, with reference to FIG. 4A to FIG. 4D. It is assumed that the number of the segments of the CSG-DBR region subjected to the temperature control is two for simplifying the drawings. As illustrated in FIG. 4A, the semiconductor laser laser-oscillates at a given temperature. In this case, the reflection spectrum of whole of the CSG-DBR region is determined with the overlapping of the reflection spectrums of the segments of the CSG-DBR region. Each temperature of the segments before electrical power supply to the heaters is hereinafter referred to as a basal value. In FIG. 4A, the basal value is zero degrees C. The basal value is meaning a heat value of the heaters. In the case where the basal value is zero degrees C., the CSG-DBR region has an environmental temperature.

Figure 4B:
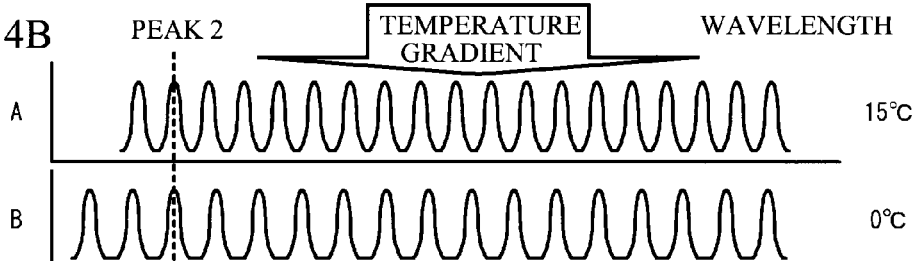

Next, as illustrated in FIG. 4B, power provision to the heaters makes temperature gradient in the segments. In this case, the temperature gradient is made so that the semiconductor laser laser-oscillates at a wavelength near the desirable wavelength. Each temperature of the segments in this case is hereinafter referred to as an initial value. In FIG. 4B, the initial temperature value of one segment is 15 degrees C., and the initial temperature value of the other segment is zero degrees C.

Figure 4C:
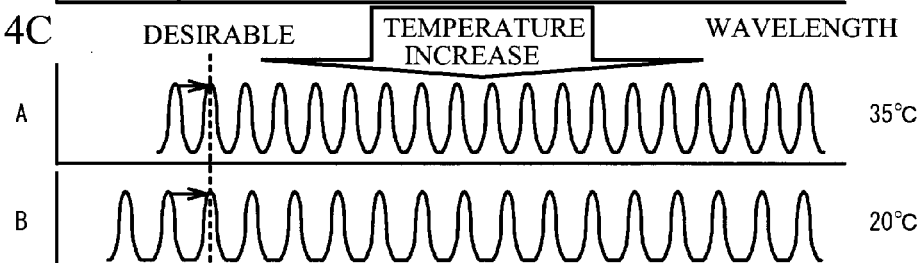

Then, as illustrated in FIG. 4C, the temperature gradient is substantially kept, and the temperature of the both segments is increased so that the oscillation wavelength of the semiconductor laser reaches to the desirable wavelength. In the example of FIG. 4C, the initial temperature value of one segment is 35 degrees C., and the initial temperature value of the other segment is 20 degrees C.

A description will be given of a case where the temperature of each segment is increased, and the oscillation wavelength shifts toward long wavelength. In this case, the oscillation wavelength shifts toward long wavelength with temperature increase of each segment, and the oscillation wavelength jumps to another predetermined value of shorter wavelength side when the temperature reaches a predetermined value. The oscillation wavelength shifts toward long wavelength with further temperature increase of each segment. In this way, the oscillation wavelength repeats in a single direction within a given wavelength range in a given periodic temperature. In the example of FIG. 4C, the oscillation wavelength repeats in a single direction in the periodic temperature of 30 degrees C.

Figure 4D:
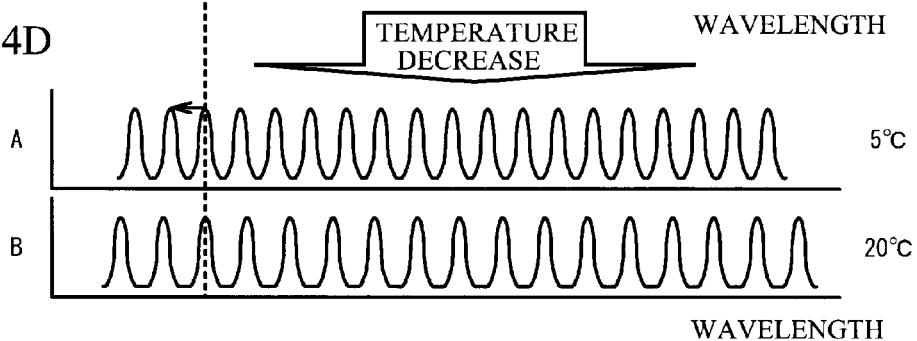

Much power provision to the heaters is needed for keeping of high temperature of each segment. And so, in the embodiment, it is determined whether the temperature of each segment is controlled to be higher than the basal value by one period or more. If the temperature of each segment is higher than the basal value by one period or more, the temperature of the segment is shifted to the basal value side by periodic. In the example of FIG. 4D, the temperature of each segment is increased to 70 degrees C., and after that, the temperature of each segment is decreased by more than one period and is decreased to 5 degrees C.

In this case, the power amount provided to the heaters may be reduced without changing of the oscillation wavelength. Thus, the power consumption of the laser device 100 may be reduced. The degradation of the semiconductor laser is reduced and the reliability of the semiconductor laser is improved because the temperature of the semiconductor laser is reduced.

Figure 5:
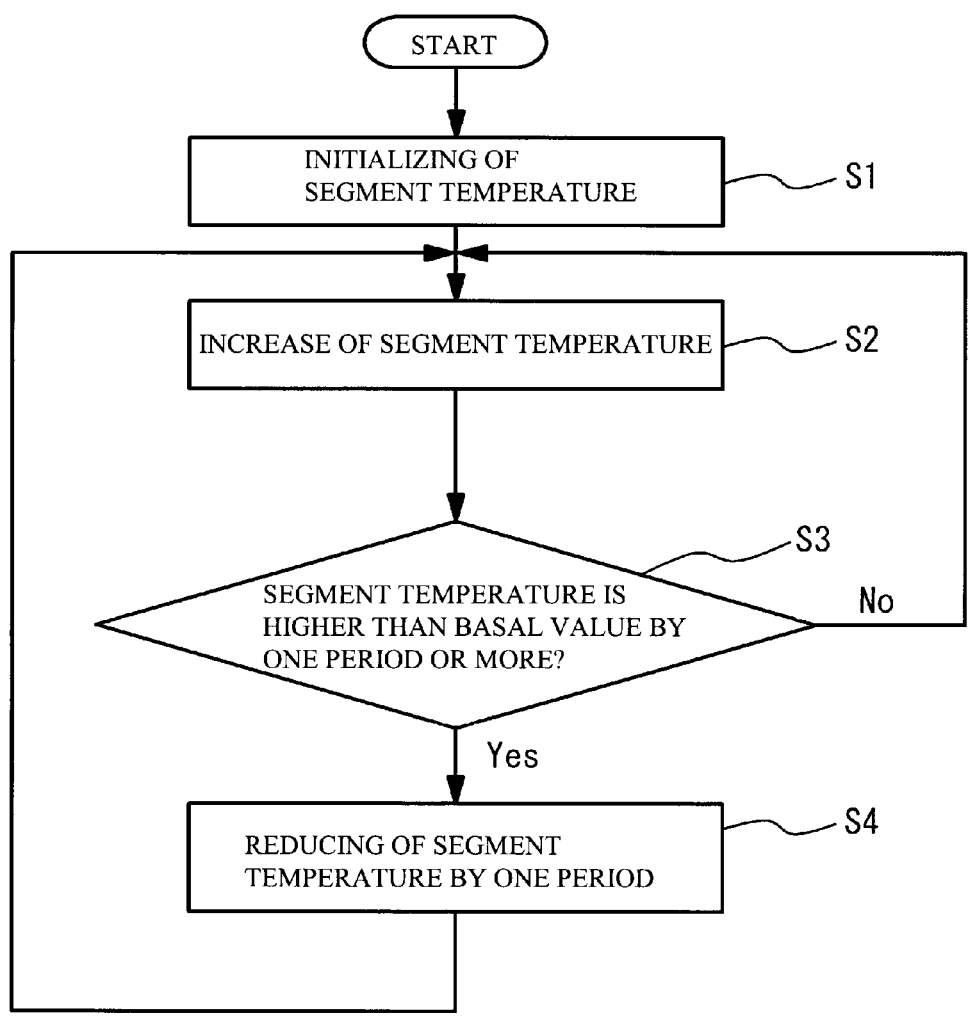
FIG. 5 illustrates an example of a flowchart executed by a controller.

A description will be given of the above-mentioned control of the laser device 100 with reference to FIG. 5 and FIG. 6A to FIG. 6E. FIG. 5 illustrates a flowchart executed by the controller 30. FIG. 6A to FIG. 6E illustrate a relation between the temperature and the reflection spectrum of the segments CSG1 to CSG3.

Figure 6A:
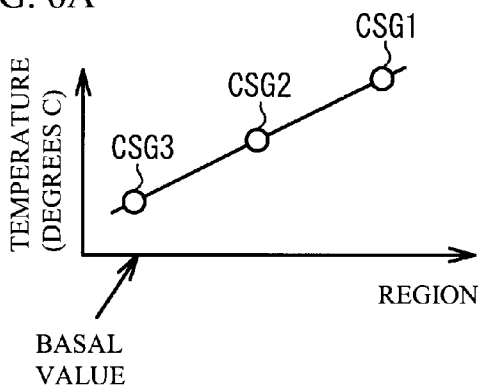
FIG. 6A to FIG. 6E illustrate a relation between a temperature of a segment and the reflection spectrum of the CSG-DBR region.
Figure 6B:
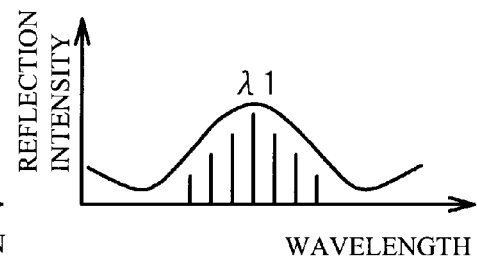

As illustrated in FIG. 5, the controller 30 provides a predetermined current to the electrodes 15 and 16, and provides electrical power to the heaters 14a to 14c so that the temperature of the segments CSG1 to CSG3 reaches the initial value (Step S1). In this case, the controller 30 controls the electrical power provided to the heaters 14a to 14c so that the temperature difference between the segments CSG1 to CSG3 is set according to the ratio of the optical lengths of the segments CSG1 to CSG3. Thus, as illustrated in FIG. 6B, the reflection spectrum of the CSG-DBR region 11 is controlled to be a bell shape. In the example of FIG. 6B, the wavelength of the reflection spectrum having the largest reflection intensity is λ1.

Figure 6C:
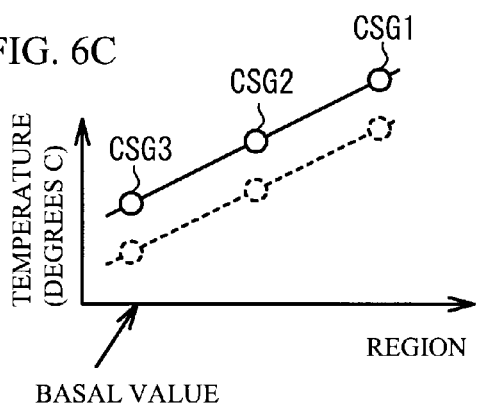
Figure 6D:
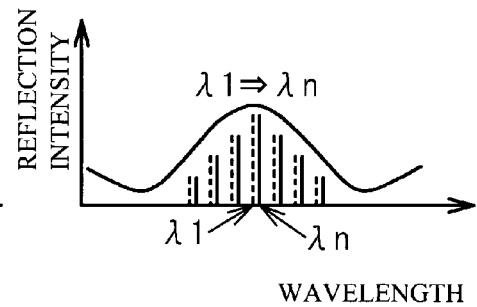

Next, the controller 30 increases the temperature of the segments CSG1 to CSG3 (Step S2). In this case, the controller 30 keeps the temperature difference between the segments CSG1 to CSG3 substantially constant and increases the temperature of the segments CSG1 to CSG3, as illustrated in FIG. 6C. Thus, the peak wavelength may be shifted without the changing of the wavelength range of the bell-shaped wavelength characteristics, as illustrated in FIG. 6D. In the example of FIG. 6D, the peak wavelength is shifted from λ1 to λn. This allows the laser oscillation of the semiconductor laser 10 at the desirable wavelength.

Then, the controller 30 determines whether the temperature of the segments CSG1 to CSG3 is higher than the basal value by one periodic or more (Step S3). If it is not determined that the temperature of the segments CSG1 to CSG3 is higher than the basal value by one periodic or more in Step S3, the controller 30 executes Step S2 again.

Figure 6E:
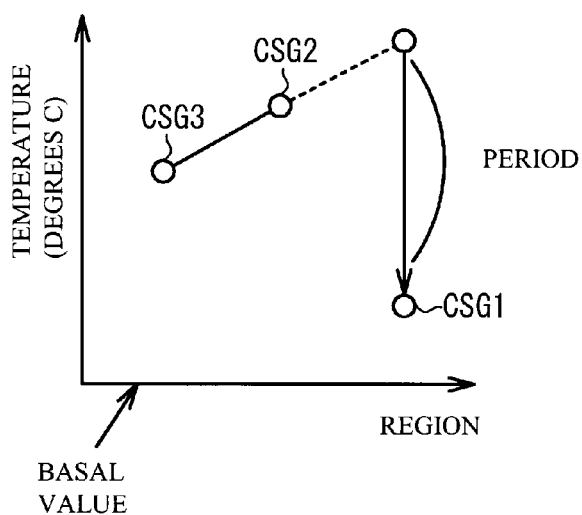

If it is determined that the temperature of the segments CSG1 to CSG3 is higher than the basal value by one periodic or more in Step S3, the controller 30 reduces the temperature of the segment by one periodic or more as illustrated in FIG. 6E (Step S4). After that, the controller 30 executes Step S2 again.

With the flowchart of FIG. 5, the electrical power provision amount to the heaters 14a to 14c may be reduced without the changing of the oscillation wavelength. Thus, the power consumption of the laser device 100 may be reduced. And, the degradation of the semiconductor laser 10 may be restrained and the reliability of the semiconductor laser 10 may be improved, because the temperature of the semiconductor laser 10 is reduced.

It is preferable that the temperature difference error of the segments CSG1 to CSG3 is within −0.5 degrees C. to 0.5 degrees C., when the temperature difference between the segments CSG1 to CSG3 is increased in Step S2.

Figure 7:
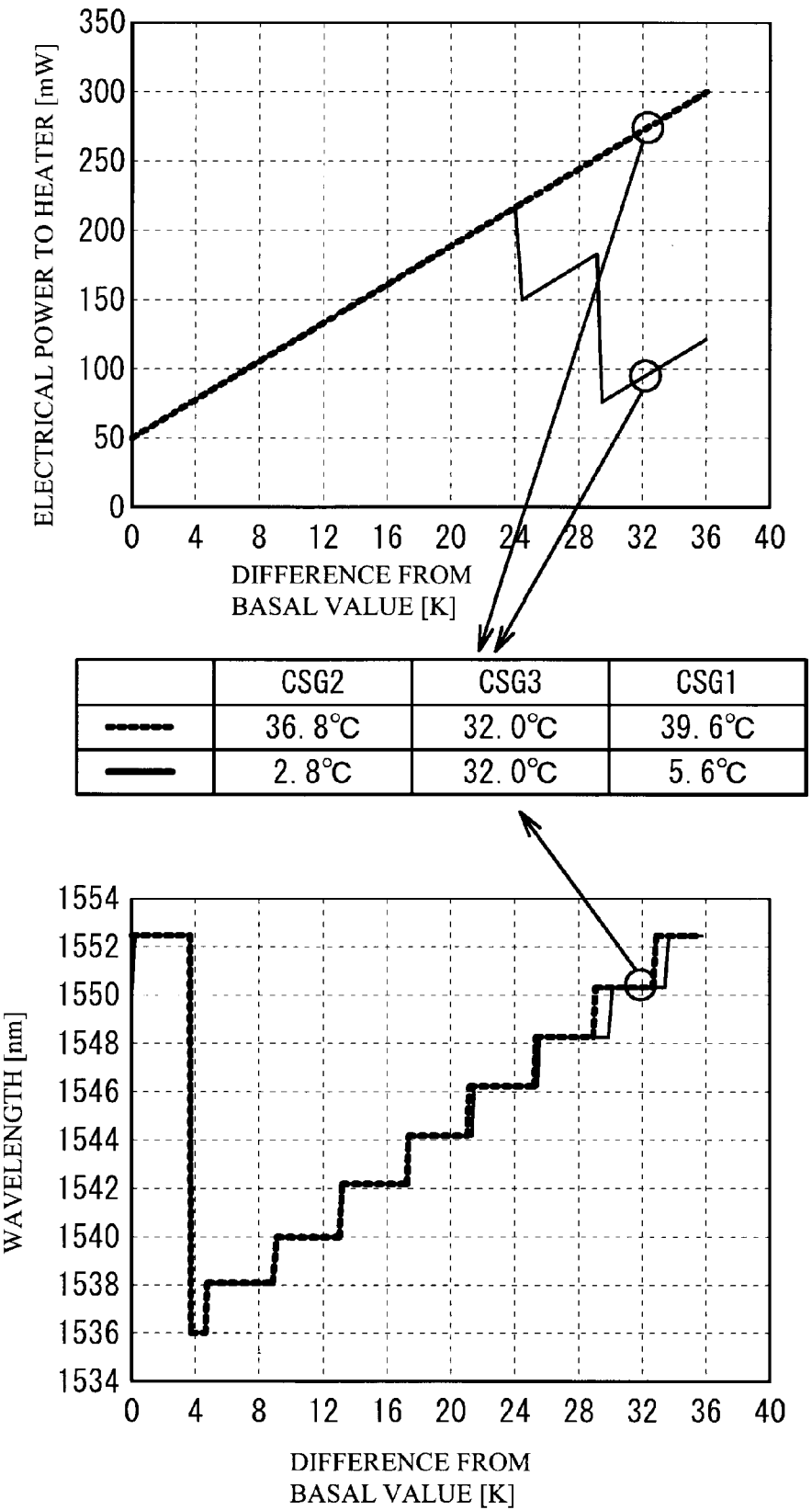
FIG. 7 illustrates an actual temperature control of the heater.

FIG. 7 illustrates an actual temperature control of the heaters 14a to 14c. A dotted line of FIG. 7 indicates a case where the temperature of the segments CSG1 to CSG3 was increased. A solid line of FIG. 7 indicates a case where the temperature of the segments CSG1 and CSG2 was reduced by one periodic. Therefore, the temperature of the segment CSG3 was the same in both of the cases. In the case of the dotted line of FIG. 7, the temperature of the segments CGS2 was reduced after the temperature of the segment CSG1 was reduced.

As illustrated in FIG. 7, total amount of the electrical power of the heaters was reduced by reducing the temperature of the segment CSG1, and was further reduced by reducing the temperature of the segment CSG2. On the other hand, the oscillation wavelength was hardly changed. Thus, the oscillation wavelength may be kept even if the temperature of the segment is reduced by per periodic.

The CSG-DBR is used as a distributed reflector in the embodiment. However, the structure in not limited to the embodiment. A SG-DBR region including segments having substantially the same optical length may be used. In this case, a reflection spectrum of the SG-DBR may be formed to be the bell shape by making the temperature gradient of the segments. Therefore, the electrical power provision amount to the heaters may be reduced without the changing of the oscillation wavelength by reducing the temperature of the segment toward the basal value side by per periodic when the temperature of the segment is higher than the basal value by one period or more.

The temperature of the segment is used as the parameter for controlling the refraction index of the segment in the embodiment. However, the structure in not limited to the embodiment. For example, the temperature of the heaters or the electrical power provision amount to the heaters may be used as the parameter for controlling the refraction index of the segment. The refraction index of the segment may be controlled by providing the current to the segment, and the current value may be used as the parameter for controlling the refraction index.

Second Embodiment

Figure 8:
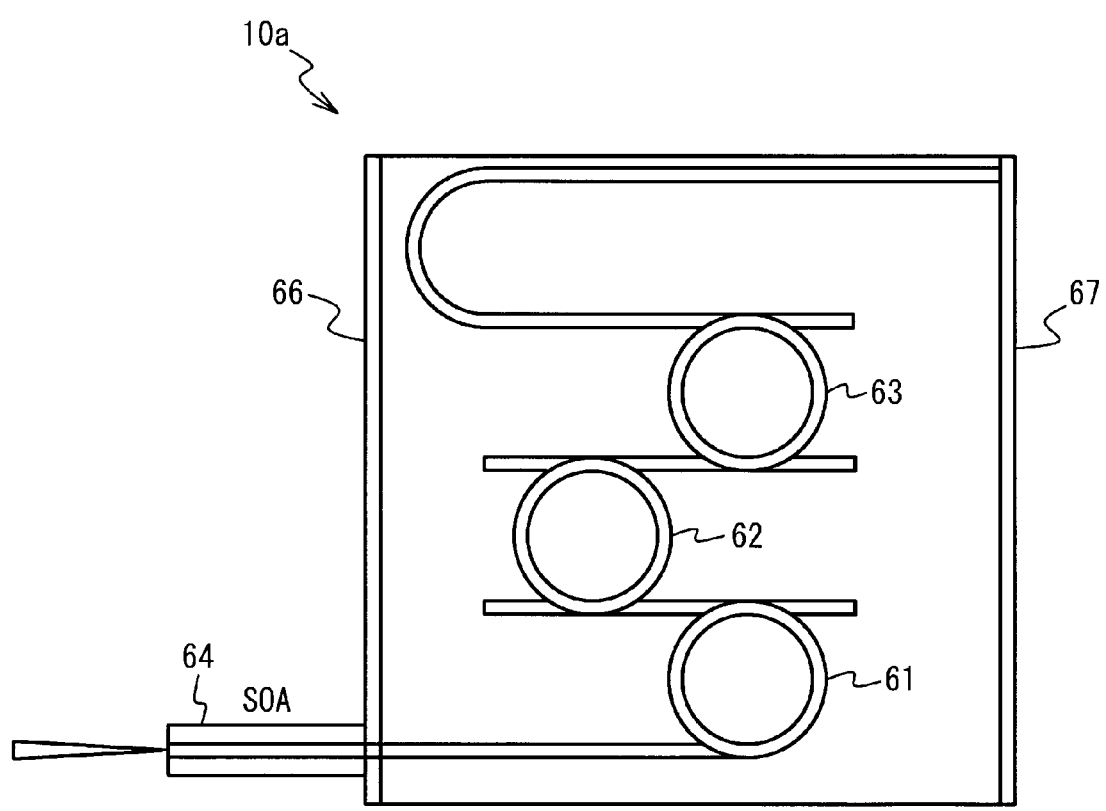
FIG. 8 illustrates a schematic view of a semiconductor laser in accordance with a second embodiment.

FIG. 8 illustrates a schematic view of a semiconductor laser 10a in accordance with the second embodiment. The semiconductor laser 10a is a laser of ring resonator type. As illustrated in FIG. 8, the semiconductor laser 10a has ring resonators 61, 62 and 63 optically coupled to each other, and a SOA region 64 optically coupled to the ring resonators 61, 62 and 63. The ring resonator 61, the ring resonator 62 and the ring resonator 63 are optically coupled in this order from the SOA region 64 side. An AR (Anti Reflection) film 66 is formed on one edge face on the side of the ring resonator 61. A HR (High Reflection) film 67 is formed on the other edge face on the side of the ring resonator 63.

The ring resonator 61 is a resonator having a period peak in the wavelength characteristics, and acts as a filter having a peak of reflection spectrum periodically at a given wavelength interval. The ring resonator 61 has the same wavelength characteristics as the SG-DFB region 12 of the semiconductor laser 10 of the first embodiment, and determines a wavelength at which the semiconductor laser 10a can oscillate.

The ring resonators 62 and 63 are a resonator having a period peak in the wavelength characteristics, and acts as a filter having a peak in the reflection spectrum periodically at a given interval. Both of the ring resonators 62 and 63 have a different diameter from the ring resonator 61. The periodic peak of the reflection spectrum appears only in a given wavelength range because the ring resonators 62 and 63 are provided. Therefore, the ring resonators 62 and 63 have the same wavelength characteristics as the CSG-DBR region 11 of the semiconductor laser 10a of the first embodiment.

The ring resonators 62 and 63 have a heater on a ring and under the ring. Each heater controls the refraction index of the ring resonators 62 and 63. Therefore, the oscillation wavelength of the semiconductor laser 10a may be controlled by controlling the temperature of each heater.

In the semiconductor laser 10a, a vernier effect occurs with the overlapping between the peak of the reflection spectrum of the ring resonator 61 and that of the ring resonators 62 and 63, and a wavelength at which an oscillation is established is selected. The SOA region 64 is a semiconductor optical amplifier allowing a gain in the resonators.

In the semiconductor laser 10a, the wavelength characteristics illustrated in FIG. 4 appears. Therefore, when the temperature of the ring resonators 62 and 63 is higher than the basal value by one periodic or more, the temperature of the ring resonator is reduced toward the basal value side by periodic. In this case, the electrical power provision amount to the heaters may be reduced without changing of the oscillation wavelength. Thus, the power consumption may be reduced.

The temperature of the ring resonator is used as the parameter for controlling the refraction index of the ring resonator in the embodiment. However, the structure is not limited to the embodiment. For example, the temperature of the heaters or the electrical power provision amount to the heaters may be used as the parameter for controlling the refraction index of the resonator. The refraction index of the resonator may be controlled with the current to the resonator, and the current value may be used as the parameter for controlling the refraction index of the resonator.

The present invention is not limited to the specifically described embodiments and variations but other embodiments and variations may be made without departing from the scope of the claimed invention.

What is claimed is:

1. A method for tuning a semiconductor laser including a plurality of wavelength selection portions, each of which has a periodic wavelength reflection characteristic, comprising:
   tuning a parameter value of the wavelength selection portions of the semiconductor laser with respect to each wavelength channel in using the semiconductor laser;
   controlling a value of a refractive index controlling means of the wavelength selection portions to achieve a desired output wavelength of the laser; and
   shifting the value when the value is equal to or excess of a predetermined value to a basal value side when the desired output wavelength is achieved, the basal value being a value without applying refractive index variation by the refractive index controlling means, the predetermined value being a value for shifting one period of the periodic wavelength reflection characteristic.

2. The method as claimed in claim 1, wherein the plurality of wavelength selection portions have a distributed reflector region having a plurality of segments in which a diffractive grating region having a diffractive grating and a space region are coupled to each other.

3. The method as claimed in claim 1, wherein the value for changing a refractive index of the wavelength selection portion is a temperature of a segment.

4. The method as claimed in claim 1, wherein the value for changing a refractive index of the wavelength selection portion is a current value provided to a segment.

5. The method as claimed in claim 2, wherein each optical length of the plurality of the segments is different from each other.

6. The method as claimed in claim 1, wherein the wavelength selection portion has a plurality of segments in which a diffraction grating region having a diffractive grating and a space region are coupled to each other, and is optically coupled to a gain region having a gain.

7. The method as claimed in claim 1, wherein each of the plurality of the wavelength selection portions is a ring resonator.

8. The method as claimed in claim 1, wherein the value of the refractive index controlling means of the wavelength selection portions is set according to a ratio of the optical lengths of the wavelength selection portions.

9. The method as claimed in claim 1, wherein the refractive index controlling means of the wavelength selection portions keep the refractive index difference between the wavelength selection portions substantially constant and change the refractive index of the wavelength selection portions.

10. The method as claimed in claim 1, further comprising checking whether a value of the refractive index controlling means of the wavelength selection portions to achieve a desired output wavelength of the laser is the predetermined value.

11. The method as claimed in claim 10, wherein the value of the refractive index controlling means of the wavelength selection portions to achieve the desired output wavelength of the laser is controlled, after checking whether a value of the refractive index controlling means of the wavelength selection portions to achieve a desired output wavelength of the laser is the predetermined value.

* * * * *